United States Patent
Xu et al.

(10) Patent No.: US 10,567,015 B2
(45) Date of Patent: Feb. 18, 2020

(54) METHOD AND RADIO NETWORK NODE FOR COMPENSATION FOR LOCAL OSCILLATOR PULLING OR PUSHING

(71) Applicant: Telefonaktiebolaget LM Ericsson (publ), Stockholm (SE)

(72) Inventors: Yuanjun Xu, Solna (SE); Youping Su, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 328 days.

(21) Appl. No.: 15/541,032

(22) PCT Filed: Jan. 5, 2015

(86) PCT No.: PCT/CN2015/070119
§ 371 (c)(1),
(2) Date: Jun. 30, 2017

(87) PCT Pub. No.: WO2016/109923
PCT Pub. Date: Jul. 14, 2016

(65) Prior Publication Data
US 2018/0019771 A1 Jan. 18, 2018

(51) Int. Cl.
*H04B 1/04* (2006.01)
*H03L 7/099* (2006.01)
(Continued)

(52) U.S. Cl.
CPC .............. *H04B 1/0475* (2013.01); *H03J 7/04* (2013.01); *H03L 7/085* (2013.01); *H03L 7/099* (2013.01);
(Continued)

(58) Field of Classification Search
CPC ....................................................... H04L 27/04
See application file for complete search history.

(56) References Cited

U.S. PATENT DOCUMENTS 3,939,438 A * 2/1976 Taylor ................... H03L 7/0891
331/14
4,219,783 A * 8/1980 Carter ................... H03L 7/0893
327/12
(Continued)

FOREIGN PATENT DOCUMENTS

CN 103427866 A 12/2013
EP 2477327 A1 7/2012

OTHER PUBLICATIONS

3GPP, "3rd Generation Partnership Project; Technical Specification Group Radio Access Network; Evolved Universal Terrestrial Radio Access (E-UTRA); Physical channels and modulation (Release 12)", 3GPP TS 36.211 V12.3.0, Sep. 2014, 1-124.

*Primary Examiner* — Bernarr E Gregory
(74) *Attorney, Agent, or Firm* — Sage Patent Group (57) ABSTRACT

Disclosed is a method and a radio network node for compensating for local oscillator pulling or pushing. The method comprises determining, in a digital domain, a correction phase for the local oscillator to offset a phase error caused by the local oscillator pulling or pushing. The method also comprises correcting a phase of the baseband signal in the digital domain using the correction phase to compensate for the local oscillator pulling or pushing With the proposed method and radio network node, the phase error caused by the local oscillator pulling or pushing could be diminished due to phase correction in the digital domain.

15 Claims, 5 Drawing Sheets

(51) Int. Cl.
*H04B 1/10* (2006.01)
*H03J 7/04* (2006.01)
*H03L 7/085* (2006.01)
*H03L 7/197* (2006.01)
*H04B 1/00* (2006.01)

(52) U.S. Cl.
CPC .......... *H04B 1/1036* (2013.01); *H03L 7/1976* (2013.01); *H03L 2207/50* (2013.01)

(56) References Cited

U.S. PATENT DOCUMENTS

| | | | | |
|---|---|---|---|---|
| 4,752,748 A | * | 6/1988 | Grzeszykowski | H03L 7/093 331/1 A |
| 5,208,546 A | * | 5/1993 | Nagaraj | H03L 7/095 327/157 |
| 5,373,255 A | * | 12/1994 | Bray | H03L 7/093 331/1 A |
| 5,373,258 A | * | 12/1994 | Gerot | H03L 7/091 331/14 |
| 5,847,611 A | * | 12/1998 | Hirata | H03L 7/1976 331/1 A |
| 6,005,425 A | * | 12/1999 | Cho | H03L 7/093 327/156 |
| 6,577,695 B1 | * | 6/2003 | Everitt | H03L 7/087 327/156 |
| 7,579,886 B2 | * | 8/2009 | Hufford | H03L 7/081 327/147 |
| 7,808,325 B2 | | 10/2010 | Waheed et al. | |
| 8,222,939 B2 | * | 7/2012 | Takinami | H03L 7/16 327/156 |
| 9,172,570 B1 | * | 10/2015 | Li Puma | H04L 27/04 |
| 2006/0202767 A1 | * | 9/2006 | Nayler | H03L 7/06 331/16 |
| 2010/0283665 A1 | | 11/2010 | Bashir et al. | |
| 2011/0002424 A1 | | 1/2011 | Le Guillou | |
| 2014/0191815 A1 | * | 7/2014 | Mirzaei | H03L 7/085 331/1 A |

* cited by examiner

METHOD AND RADIO NETWORK NODE FOR COMPENSATION FOR LOCAL OSCILLATOR PULLING OR PUSHING

TECHNICAL FIELD

The exemplary embodiments of the present disclosure relate generally to wireless communication field and, more specifically, relate to a method and a radio network node for compensation for local oscillator ("LO") pulling or pushing.

BACKGROUND

This section is intended to provide a background or context to the invention that is recited in the claims. The description herein may include concepts that could be pursued, but are not necessarily ones that have been previously conceived, implemented or described. Therefore, unless otherwise indicated herein, what is described in this section is not prior art to the description and claims in this application and is not admitted to be prior art by inclusion in this section.

Cellular technologies specified by the 3rd Generation Partnership Project ("3GPP") are widely deployed around the world. A new step being studied and developed in 3GPP is an evolution from the 3G technology into an evolved radio access technology, which is commonly referred to as Long Term Evolution ("LTE"). In LTE, different communication modes may be utilized by radio nodes in a cellular network in various modes, such as Frequency Division Duplex ("FDD"), Time Division Duplex ("TDD") and half duplex modes.

In the TDD mode, a single physical channel may be utilized for both uplink and downlink transmissions which are separated in time in communication between a radio network node, such as a radio base station, and a user terminal, such as a mobile station. In other words, the uplink ("UL") and downlink ("DL") transmission should take place in different, non-overlapping time slots. Due to this, the participating radio nodes are required to switch between a transmit mode and a receive mode according to a predefined radio frame scheme in order to avoid that uplink and downlink transmissions occur simultaneously on that physical channel.

Figure 1:
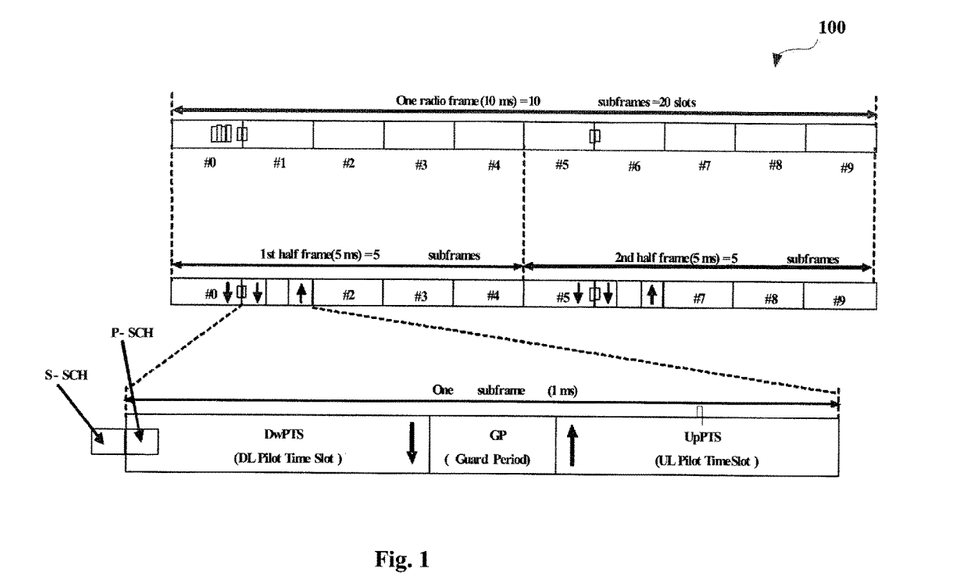
FIG. 1 illustrates example structures of one radio frame and one subframe in the radio frame in a time domain.

FIG. 1 exemplarily illustrates such an LTE TDD radio frame, which has a length of 10 ms and consists of ten equally sized subframes each with a length of 1 ms. As shown in FIG. 1, there are two switching points for each half frame for switching between the uplink and downlink transmission. The first switching point (DL→UL) takes place in the middle of a special subframe, which includes the DwPTS, GP, and UpPTS parts as shown at the lower part of FIG. 1. In addition, according to 3GPP TS 36.211 v.12.3.0, the UL timing will be advanced by 624/30.72=20.3125 us. Therefore, the 20 us before the first DL subframe is used for second switching point (UL→DL). For the TDD LTE, either at the UL→DL switching time or at the DL→UL switching time, it is critical to switching on/off the components in the receiver ("RX") path and transmitter ("TX") path in a right sequence.

A direct-conversion transmitter is widely used in a base station in which no intermediate frequency ("IF") stage is used, i.e., no IF up-conversion stage and IF filters involved. Instead, a baseband signal would be directly modulated up to the radio frequency ("RF") carrier. For a direct-conversion TDD base station, the TX LO frequency is identical to an air interface carrier frequency. To avoid influence on the reception of close-by other TDD base stations, the 3GPP requires the transmitter OFF power spectral density of the base station to be less than −85 dBm/MHz. Further, the transmitter OFF power spectral density should be much lower than −85 dBm/MHz to avoid influence on its own reception, which imposes a challenge to the phase noise and lock time of the TX LO phase locking loop ("PLL").

Figure 2:
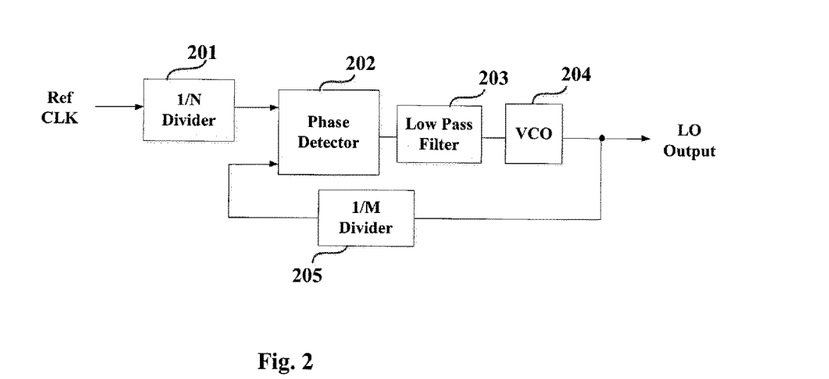
FIG. 2 is a block diagram exemplarily illustrating circuit components of a radio frequency local oscillator circuit.

FIG. 2 schematically illustrates a block diagram of a TX LO PLL circuitry in the prior art, which, among other things, may include a 1/N divider 201, a phase detector 202, a loop low pass filter 203, a voltage controlled oscillator ("VCO") 204, a 1/M divider 205. The TX LO PLL as illustrated herein may have a narrow bandwidth in order to get good phase noise. Due to this, a TX LO may take a long time, which is much longer than 20 us switching time for UL→DL as discussed before, to change from an unlocked state to a locked state, meaning that it is not feasible to shut off the TX LO at uplink receiving intervals. For instance, it is a reasonable way to switch the TX LO to matched load at the uplink receiving intervals to minimize the leakage to the receiver. However, when switching the TX LO to matched load at the uplink receiving intervals and switching back for normal TX transmitting operations, a change in impedance as seen by the VCO output, for example, LO Output as shown in FIG. 2, is inevitable. This will induce a change in the DC voltage across junctions of the VCO active devices, and then cause the whole PLL to relock to the VCO changing, resulting in a problem commonly known as "LO pulling."

The "LO pulling" may also be caused by RF energy conducted through the signal path and fed back to the VCO output. This may be due to the RF power amplifier ("PA") turning on or off, which may take place at every switching point in the TDD base station. This may give rise to an impedance change in the signal path or in other circuits, thereby picking up radiated RF energy and conducting it back through the signal path.

Regardless of whether the LO pulling stems from the changes in impedance, external interference, its own transmitter signal, by the DC power supply voltage or the ground level, the transmitter signal quality, for example, Error Vector Magnitude ("EVM") may be significantly degraded due to this.

The "LO pushing" may arise when LO frequency or phase changes are caused by small changes of DC power supply voltage(s). As mentioned before, the TDD base station is required to switch between a transmit mode for downlink transmission and a receive mode for uplink reception and the current consumption in the transmit mode should be much higher than that in the receive mode. This will cause the LO DC power supply voltage or even the ground level to vary with the link switching (UL→DL or DL→UL), which results in the LO pushing. In addition, changes in the DC power supply voltage may be caused by some static offset (dispersion) around a nominal value or random noise with some ripples of particular frequencies. The former may cause a shift in the frequency tuning characteristic and the latter may result in some degradation of the phase/amplitude noise spectrum. In other words, the LO pushing may also degrade the signal quality of the radio frequency signal.

SUMMARY

It is an object of the present disclosure to at least address the problems outlined above, and to provide methods and network nodes for compensating for local oscillator pulling or pushing as follows.

According to an aspect of the present disclosure, there is provided a method implemented by a radio network node for compensating for local oscillator pulling or pushing. The method comprises determining, in a digital domain, a correction phase for the local oscillator to offset a phase error caused by the local oscillator pulling or pushing. The method also comprises correcting a phase of the baseband signal in the digital domain using the correction phase to compensate for the local oscillator pulling or pushing.

In one or more embodiments, the determining the correction phase is implemented by an adaptive phase correction algorithm and the method further comprises iteratively performing the following steps until the phase error is minimized. These steps comprise receiving transmitter observing receiver signal fed back from a transmitting chain, determining the correction phase corresponding to the phase error based on a comparison between the baseband signal and the transmitter observing receiver signal, and correcting the phase of a subsequent baseband signal using the correction phase.

In one or more embodiments, the determining the correction phase is implemented by a look-up table in which a plurality of respective correction phases are stored in association with a plurality of respective time points and the method further comprises searching the look-up table for the correction phase based on a respective time point which corresponds to a received time of the baseband signal and correcting the phase of the baseband signal using the searched correction phase.

According to another aspect of the present disclosure, there is provided a radio network node for compensating for local oscillator pulling or pushing. The radio network node comprises a processor and a memory, the memory containing instructions executable by the processor, whereby the radio network node is operative to determine, in a digital domain, a correction phase for the local oscillator to offset a phase error caused by the local oscillator pulling or pushing, and is operative to correct a phase of the baseband signal in the digital domain using the correction phase to compensate for the local oscillator pulling or pushing.

According to a further aspect of the present disclosure, there is provided a radio network node for compensating for local oscillator pulling or pushing. The radio network node comprises processing means operative to determine, in a digital domain, a correction phase for the local oscillator to offset a phase error caused by the local oscillator pulling or pushing and operative to correct a phase of the baseband signal in the digital domain using the correction phase to compensate for the local oscillator pulling or pushing.

According to an additional aspect of the present disclosure, there is provided a radio network node for compensating for local oscillator pulling or pushing. The radio network node comprises a determining module for determining, in a digital domain, a correction phase for the local oscillator to offset a phase error caused by the local oscillator pulling or pushing. The radio network node also comprises a correcting module for correcting a phase of the baseband signal in the digital domain using the correction phase to compensate for the local oscillator pulling or pushing.

By means of the solutions set forth in the above aspects and embodiments of the present disclosure and those as will be discussed hereinafter, the phase error caused by the local oscillator pulling or pushing could be diminished due to phase correction in the digital domain. Further, due to the phase correction in the digital domain instead of in the analog domain, hardware overhead and cost could be notably saved and easy technical implementation could be achieved, for example, with the look-up table.

From the prospective of technical implementation, the solutions as proposed by the present disclosure may be achieved by software or firmware, or a combination thereof. Further, if the radio transmission path has been arranged with digital pre-distortion ("DPD") functionality from which the transmitter observing receiver ("TOR") signal or data could be obtained, the extra hardware cost may be saved. By taking advantage of digital signal processing, the LO pulling or pushing effect may be reduced in the digital domain instead of in the analog domain. By making compensation for the LO pushing or pulling, the DL signal modulation quality may be improved, which in turn improves the radio network performance. Due to online adaptive correction of phase errors, the solutions as proposed by the present disclosure are insensitive to the temperature changes, component variations, the components aging and etc. Thereby, the same performance could be maintained within the whole lifecycle of the radio network node.

BRIEF DESCRIPTION OF THE DRAWINGS

In the following, the disclosure will be discussed in greater detail by means of exemplary embodiments with reference to the accompanying drawings, in which.

DETAILED DESCRIPTION

The present disclosure will now be described more fully hereinafter with reference to the accompanying drawings, in which certain embodiments of the present disclosure are shown. This disclosure may, however, be embodied in many different forms and should not be construed as limited to the embodiments set forth herein; rather, these embodiments are provided by way of example so that this disclosure will be thorough and complete, and will fully convey the scope of the present disclosure to those skilled in the art. Like numbers refer to like elements throughout the specification.

Generally, all terms used in the claims are to be interpreted according to their ordinary meaning in the technical field, unless explicitly defined otherwise herein. For example, the terminal device in the present disclosure may be any terminal capable of receiving information from and/or transmitting information to the network, connectable to the network wirelessly or via a fixed connection. Examples of a radio network node may refer to any suitable radio BS according to any suitable communication standard, such as a Node B ("NB") or an evolved NB ("eNB"), for carrying out the solutions as discussed in detail later with reference to the accompanying drawings.

All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The discussion above and below in respect of any of the aspects of the present disclosure is also in applicable parts relevant to any other aspect of the present disclosure.

Figure 3:
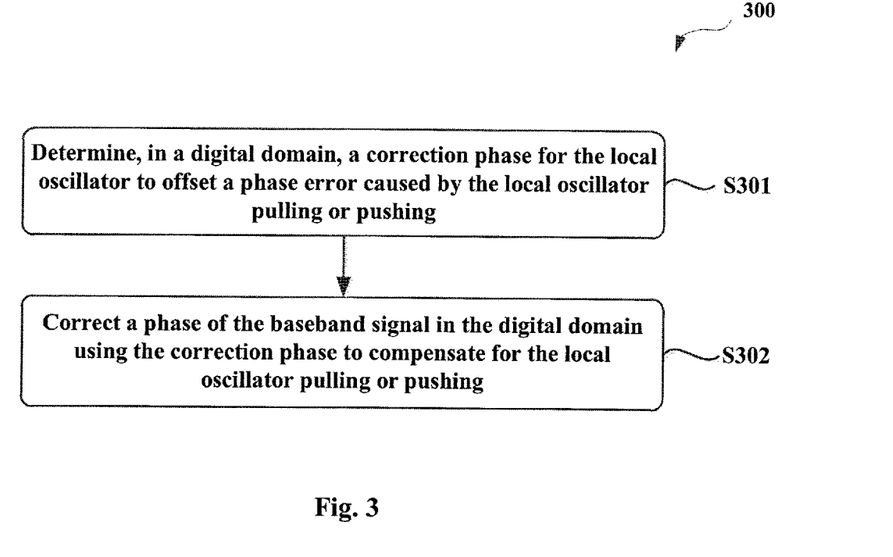
FIG. 3 is a logic flow diagram of a method implemented by a radio network node for compensating for local oscillator pulling or pushing according to one or more embodiments.

FIG. 3 is a logic flow diagram of a method 300 implemented by a radio network node for compensating for LO pulling or pushing according to one or more embodiments.

As illustrated in FIG. 3, at block S301, the method 300 determines, in a digital domain, a correction phase for the LO to offset a phase error caused by the LO pulling or pushing. In some embodiments, the determination made at the block S301 may be implemented by an adaptive phase correction algorithm, which will be discussed in detail later with reference to FIG. 4. In some embodiments, the determination made at the block S301 may be implemented by a look-up table in which a plurality of respective correction phases are stored in association with a plurality of respective time points, which will be discussed in detail later with reference to FIG. 6.

Then, at block S302, the method 300 corrects a phase of the baseband signal in the digital domain using the correction phase to compensate for the LO pulling or pushing. In some embodiments, such as when the adaptive phase correction algorithm is utilized, the baseband signal whose phase is corrected is the baseband signal this is immediately subsequent to the one from which the correction phase has been determined. In some other embodiments, such as when the look-up table is utilized, the determined correction phase would be applied to the present ingoing baseband signal.

With the method 200 and its extensions in various embodiments, the phase error caused by the LO pulling or pushing could be removed or eliminated adaptively, i.e., in a manner of online adaptive correction. Thereby, it would give the signal quality of the wireless communication a big boost. Further, since the processing performed by the method 200 is in the scope of the digital domain, it is unnecessary to arrange additional or complex analog circuits for the phase correction and therefore extra cost in this regard could be saved due to easy implementation.

Figure 4:
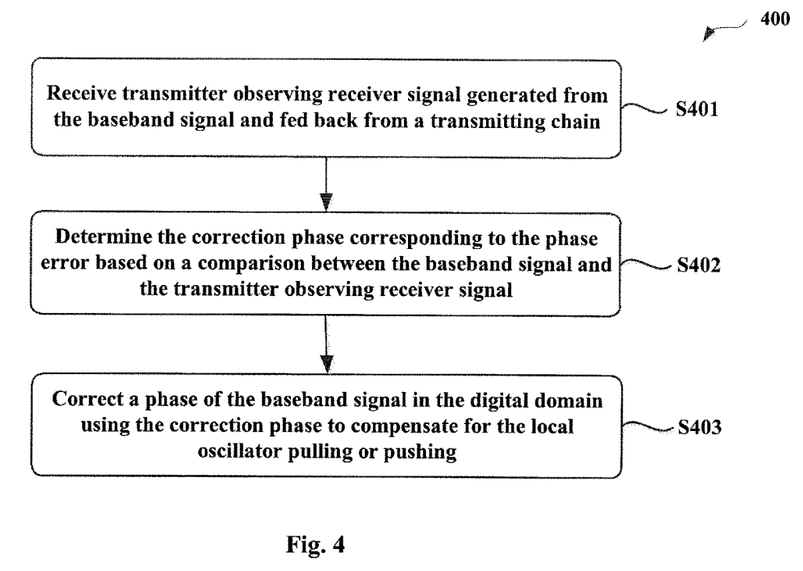
FIG. 4 is a logic flow diagram of a method implemented by a radio network node for compensating for local oscillator pulling or pushing according to one or more embodiments.

FIG. 4 is a logic flow diagram of a method 400 implemented by a radio network node for compensating for LO pulling or pushing according to one or more embodiments. More particularly, FIG. 4 illustrates the processing flow performed by the radio network node when the adaptive phase correction algorithm is utilized for the phase correction.

Figure 5:
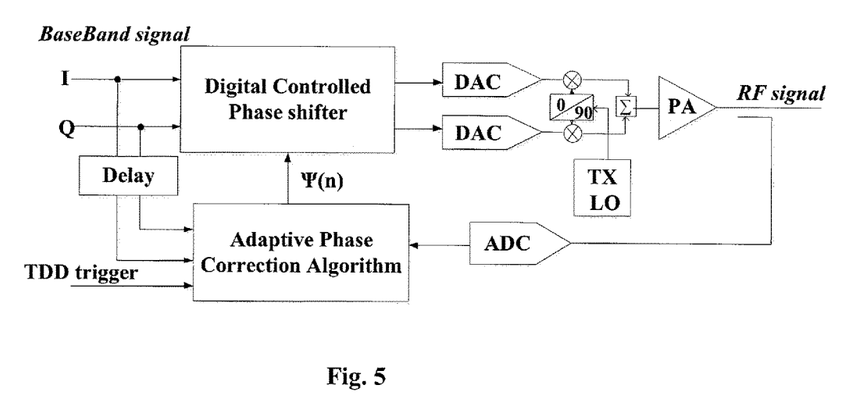
FIG. 5 is a block diagram of phase correction processing performed in the method as illustrated in FIG. 4 according to one or more embodiments.

As shown in FIG. 4, at block S401, the method 400 receives transmitter observing receiver ("TOR") signal fed back from a transmitting chain, as shown in FIG. 5. Then at block S402, the method 400 determines the correction phase corresponding to the phase error based on a comparison between the baseband signal and the transmitter observing receiver signal. Upon determination of the correction phase, the flow advances to block S403, at which the method 400 corrects the phase of a subsequent baseband signal using the correction phase.

It is to be understood that the adaptive phase correction algorithm according to the present disclosure could be implemented in many different ways using many existing adaptive algorithms, for example, a least mean square ("LMS") algorithm, an adaptive Kalman filter and etc. In some embodiments, when the LMS algorithm is utilized, different step sizes may be set according to different power levels of the baseband signals.

FIG. 5 is a block diagram of phase correction processing performed in the method as illustrated in FIG. 4 according to one or more embodiments. More particularly, FIG. 5 illustrates a possible technical implementation diagram when the adaptive phase correction algorithm is applied.

As shown in FIG. 5, the ingoing baseband signal is divided into an I branch signal and a Q branch signal and these I and Q branch signals are fed to a digital controlled phase shifter, which is capable of shifting a phase of the ingoing signal prior to transmitting to a TX modulator. Upon shifting the phase, the baseband would be transmitted to the TX modulator for modulation. The subsequent processing as shown may include digital-to-analog conversion ("DAC"), modulation, and summing. In the processing of the modulation, the TX LO will generate carrier oscillator signals whose phases would be shifted so as to generate an in-phase carrier and an out-of-phase carrier to be modulated by the modulator. After the summing operation in the summer, the resulting signal will be transmitted to a power amplifier ("PA"), from which, the amplified signal may be transmitted to a coupler (not shown) and then to the antenna (not shown) for air transmission.

In order to obtain the TOR signal or data, a TOR branch is introduced whose input is coupled to the output of the couple (not shown) and output, i.e., the output of the analog-to-digital conversion ("ADC") is fed into a block of an adaptive phase correction algorithm. As shown, the I and Q branch signals would additionally be delayed via a delay block and input to the adaptive phase correction algorithm block. A TDD trigger will be enabled at the moment when the uplink-downlink switching occurs and meanwhile, the triggering from the TDD trigger will enable the adaptive phase correction algorithm to operate according to one or more embodiments of the present disclosure.

In operation, the adaptive phase correction algorithm block may be enabled to access to the TOR data when the TDD switching point is coming and start to perform an adaptive phase compensation algorithm based on adaptive signal process technology. In particular, the adaptive phase correction algorithm block will keep monitoring the phases of the PA final output, i.e., the TOR signals, and compare these monitored phases with the digital IQ baseband signal phases on a sample-by-sample basis. Then, the adaptive phase correction algorithm block may estimate phase errors, which will be compensated online in the digital controlled phase shifter. Since this is a closed loop feedback system, the TX LO puling or pushing effect may be reduced continually and notably.

As mentioned above, there may be many adaptive phase correction algorithms that could be used for determining the phase errors, such as, the LMS algorithm, the adaptive Kalman filter and etc.

Let's take the LMS algorithm as example, if n is the current input sample, and the baseband signal may be expressed as:

$$X(n)=I(n)-j\cdot Q(n) \quad (1)$$

Assume the phase correction value is $\Psi(n)$, which could be set as 0 or any other specific values at the outset, then the baseband signal may be expressed as follows in a complex domain:

$$M(n)=\cos[\Psi(n)]-j^*\sin[\Psi(n)] \quad (2)$$

M(n) herein is the output signal from the adaptive phase correction algorithm block and in reality, the algorithm may give the following complex values directly so as to save the computation time:

$$M(n)=\alpha(n)-j\cdot\beta(n) \quad (3)$$

Take the M(n) as the input, based on current baseband signal, the output signal of the digital controlled phase shifter is as follows:

$$Y(n)=X(n)^*M(n) \quad (4)$$

If the TOR signal is D(n), the phase error as estimated is as follows:

$$e(n)=D(n)-Y(n) \quad (5)$$

with this phase error, according to the LMS, the updated phase shift value is as follows:

$$M(n+1)=M(n)+\mu\cdot e^*(n) \quad (6)$$

Here the $\mu$ is a constant value, called step size, and normally it is less than 1, and e*(n) is the complex conjugation of e(n).

According to an equation (6), a new phase offset value may be updated and prepared for the next or immediately subsequent baseband signal, for example, a next sample input. The LMS algorithm takes equations (1) and (4)-(6) as a loop to continually estimate the phase error. Once the LMS algorithm reaches its convergence state, the estimated phase error may be minimized, i.e., the LO phase offset may be compensated with a small and controlled correction phase.

In some embodiments, to improve the tracking speed of the adaptive phase correction algorithm such as the LMS algorithm, the variable step size may be applied. During the duration of the TDD switching, the step size may be increased so as to decrease the tracking time when the pulling effect is severe. Sometimes, if the LO pulling behavior may be changed by different IQ power levels, the IQ power levels should be calculated first using different adaptive step sizes, for example, the item "$\mu$" in the equation (6).

It should be noted that the blocks as shown in FIG. 5 are merely for an illustrative purpose, a person skilled in the art could make any modifications to further improve the convergence speed and simplify the circuit structure. For example, since the RF output circuit path with the low power level may be designed to operate in a linear area due to insensitivity of the traffic power level, the IQ power based compensation is not necessary. However, if the RF output signal circuit path includes a high RF power amplifier and the traffic power level may render different behaviours of the LO pulling, the IQ power levels must be known for the adaptive phase correction algorithm. In this manner, it would be helpful to minimize the algorithm convergence time and reduce the total system error.

In the practical implementation of the above adaptive phase compensation method, the delay, which may be performed by the delay block as depicted, should be calibrated before the algorithm loop start. Since the time domain continued phase may change within the TDD switching time, the delay may be hidden in the TDD edge slop. Therefore, the delay calibration should use the traffic as a basis after the LO pulling effect has finished, for example, in the middle of normal traffic. This delay calibration could also be done by disabling the PA and then using a special training pattern, such as a pseudo random signal, before the normal carrier is set up. In practice, most of time, the analog circuit delay value is not an integer multiple of the IQ traffic sample time and therefore, the fractional delay could be used. After the delay has been well calibrated, the algorithm is capable of controlling the loop to minimize the phase error of the output RF signal.

Figure 6:
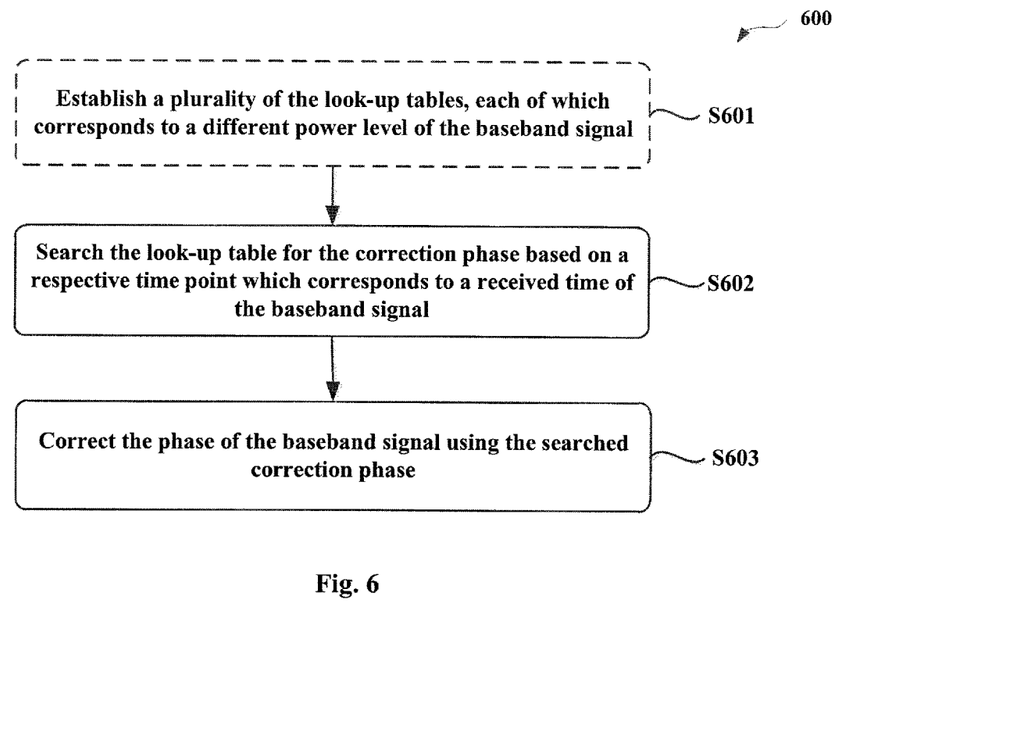
FIG. 6 is a logic flow diagram of a method implemented by a radio network node for compensating for local oscillator pulling or pushing according to one or more embodiments.

FIG. 6 is a logic flow diagram of a method 600 implemented by a radio network node for compensating for LO pulling or pushing according to one or more embodiments. More particularly, FIG. 6 illustrates the processing flow performed by the radio network node when the look-up table is utilized for the phase correction. As mentioned before, there would be a plurality of respective correction phases stored in association with a plurality of respective time points.

As shown in FIG. 6, at block S602, the method 600 searches the look-up table for the correction phase based on a respective time point which corresponds to a received time of the baseband signal. Then, at block S603, the method 600 corrects the phase of the baseband signal using the searched correction phase. In some embodiment, as an optional, at block S601, the method 600 establishes a plurality of the look-up tables, each of which corresponds to a different power level of the baseband signal.

As contrast with the solutions as illustrated in FIGS. 4 and 5, the look-up table based solutions herein may be used in the case in which the TOR signal or data cannot be available continually, for example, when the TOR data was shared by several Tx branches. The look-up table based solutions herein may also be referred to as Time-Phase control solutions, and compared with the foregoing adaptive phase correction solutions, the difference resides in that the look-up table solution is directed to an offline and blind compensation without any feedback loops. The phase correction value comes from a per-defined look-up table in which a number of times from the switching time point would be used as indices, and the phase correction values corresponding to the number of the times would be output one by one in a chronological order. The initial values in the look-up table may be determined from statistics of hardware tests or by detailed simulations. Below is an example look-up table assuming that the calculated IQ power level is 0 dBm:

TABLE 1

| look-up table with power level 0 dBm | | |
|---|---|---|
| Time (ns) | cos($\Psi$) | sin($\Psi$) |
| 2 | 0.99 | 0.14 |
| 4 | 0.90 | 0.43 |
| 6 | 0.85 | 0.52 |
| . . . | . . . | . . . |

In some concrete implementations, there may be a number of look-up tables, each table working for each IQ power level.

Figure 7:
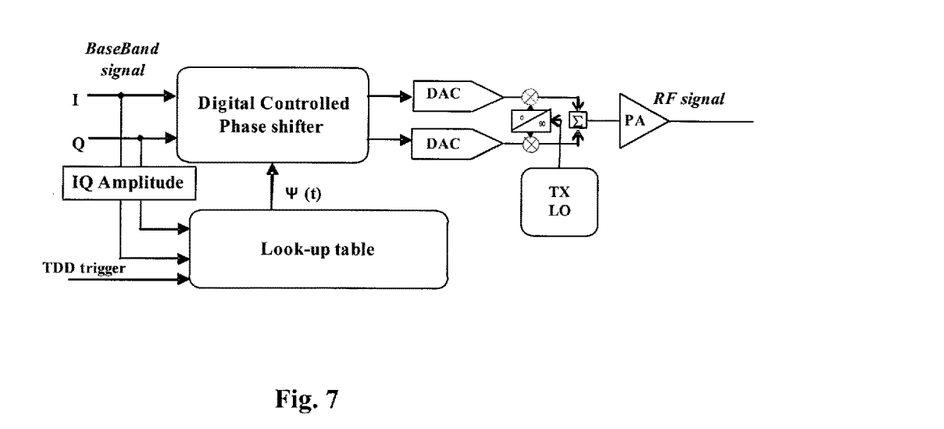
FIG. 7 is a block diagram of phase correction processing performed in the method as illustrated in FIG. 6 according to one or more embodiments.

FIG. 7 is a block diagram of phase correction processing performed in the method as illustrated in FIG. 6 according to one or more embodiments. More particularly, FIG. 7 illustrates a possible technical implementation diagram when the look-up table or Time-Phase control solution is applied. It is to be understood from the depiction that some components, such as a digital controlled phase shifter, DACs, the modulator, the TX LO, summer and the power amplifier as shown in FIG. 7 are identical to those as shown in FIG. 5. Therefore, the detailed descriptions regarding these identical components are omitted herein for a simplifying purpose.

Instead of delaying I and Q branch baseband signals, the amplitudes of the I and Q branch signals would be fed into the look-up table block. Together with the trigger signal as provided by the TDD trigger, the look-up table block would determine the phase correction value $\Psi(t)$, which may correspond to a sample of a current incoming baseband signal, and convey the phase correction value to the digital controlled phase shifter for phase correction.

The above look-up table based solutions may achieve significant technical advantages. For instance, it may reduce the hardware cost since it is simple and no complex mathematic calculations are involved. Further, it becomes more stable and robust when the look-up table is designed to fit in various hardware arrangements. Although sharing the TOR path becomes more and more common in the multi-antenna system, this look-up table does not use the TOR data and therefore it could be implemented into the TOR sharing design without too many efforts.

Figure 8A:
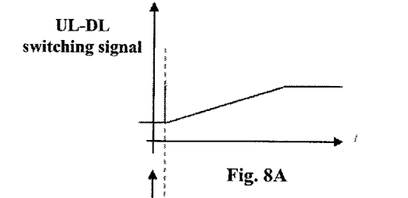
FIG. 8A-8C are diagrams exemplarily illustrating phase errors and corresponding phase corrections occurring within an uplink-downlink switching time according to one or more embodiments.
Figure 8B:
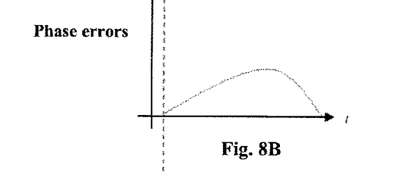
Figure 8C:
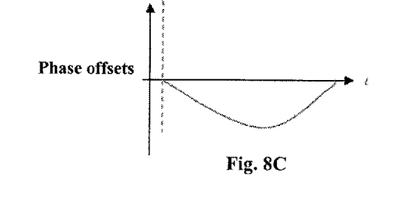

FIG. 8A-8C are diagrams exemplarily illustrating phase errors and corresponding phase corrections occurring within an uplink-downlink switching time according to one or more embodiments. More particularly, FIGS. 8A-8C depict the process of the look-up table based phase correction or compensation by two-dimensional graphs. As shown in FIGS. 8A-8C, the dashed line indicates the time point in the time axis (i.e., the horizontal axis) at which the uplink-downlink switching begins and the vertical axis may represent a voltage or power level of a switching signal for controlling the switching of the TX chain and RX chain. As can be seen from FIG. 8A, the shown line gradually arises with a certain degree of slant until it reaches a maximum value in the vertical axis, from which the line will remain horizontal and straight.

As shown in FIG. 8B, as the time passes in the time axis, the phase errors as represented by the vertical axis will arise slowly at the initial stage and then decrease progressively after it reaches a peak. In contrast, as shown in FIG. 8C, the phase offset or phase correction values are exactly opposite to the phase errors as shown in FIG. 8B. That is to say, the phase correction value as shown in the vertical axis in the FIG. 8C will completely offset or compensate the phase errors as shown in the FIG. 8B.

From the above depiction in the FIGS. 8A-8C, a person skilled in the art is about to understand that even in the digital domain, the TDD switching signal may be switched very quickly between the Rx and Tx modes due to some constraints of the circuit. This fast edge may be sloped sometimes and therefore a designer should add a controlled slope to reduce the emission of this fast edge and the PA ringing effect at the switching point and take account of the fact that all digital signals may have a small rising time. To this end, the look-up table may store the compensated phase values that may overcome or compensate for the LO pushing or pulling, and provide the phase correction values to offset the phase error before the LO pulling arises. These looking-up and correcting operations are very similar to those phase pre-distortion in the digital domain in which the original baseband signals will be rebuilt or reconstructed after all analog phase pushing or puling effect.

Figure 9:
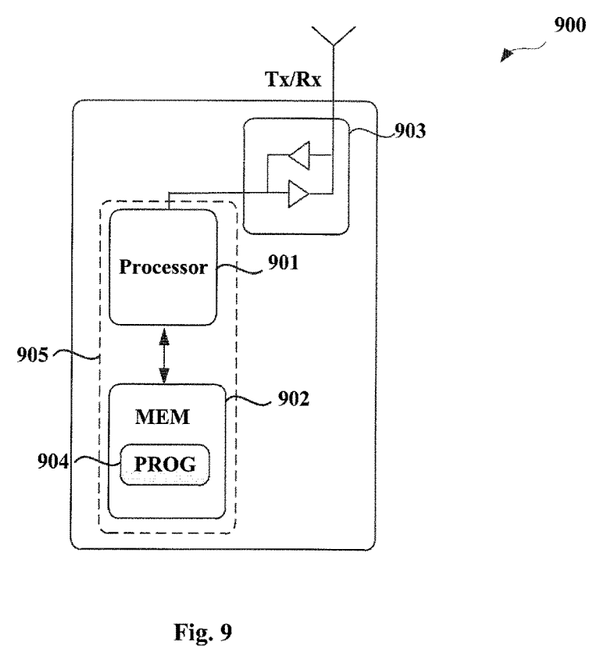
FIG. 9 is a schematic block diagram showing a radio network node suitable for implementing exemplary embodiments of the present disclosure detailed herein.

FIG. 9 is a schematic block diagram showing a radio network node 900 suitable for implementing exemplary embodiments of the present disclosure detailed herein.

As illustrated in FIG. 9, the radio network node 900 includes at least one processor 901, such as a data processor, at least one memory (MEM) 902 coupled to the processor 901, and a suitable RF transmitter TX and receiver RX 903 coupled to the processor 901. The MEM 902 stores a program (PROG) 904. The TX/RX 903 is for bidirectional wireless communications.

The PROG 904 is assumed to include instructions that, when executed by the processor 901, enable the radio network node 900 to operate in accordance with the example embodiments of the present disclosure, as discussed herein with the methods 300, 400, and 600. For example, the radio network node 900 may be embodied as a Base Station ("BS") or eNB, or a part thereof, to carry out the corresponding steps directed thereto as discussed in the methods 300, 400 and 600.

In general, the example embodiments of the present disclosure may be implemented by computer software executable by at least one processor 901 of the radio network node 900, or by hardware, or by a combination of software and hardware.

The MEM 902 may be of any type suitable to the local technical environment and may be implemented using any suitable data storage technology, such as semiconductor based memory devices, magnetic memory devices and systems, optical memory devices and systems, fixed memory and removable memory, as non-limiting examples. While only one MEM is shown in the radio network node 900, there may be several physically distinct memory units in the radio network node 900. The processor 901 may be of any type suitable to the local technical environment, and may include one or more of general purpose computers, special purpose computers, microprocessors, digital signal processors (DSPs) and processors based on multicore processor architecture, as non-limiting examples. The radio network node 900 may have multiple processors, such as for example an application specific integrated circuit chip that is slaved in time to a clock which synchronizes the main processor.

In addition, the at least one processor 901 and the memory 902 may be combined as processing means 905 operative to perform the relevant steps as illustrated in the methods 300, 400, and 600 with respect to the radio network node 900.

The techniques described herein may be implemented by various means so that an apparatus implementing one or more functions of a corresponding mobile entity described with an embodiment comprises not only prior art means, but also means for implementing the one or more functions of a corresponding apparatus described with an embodiment and it may comprise separate means for each separate function, or means may be configured to perform two or more functions.

Figure 10:
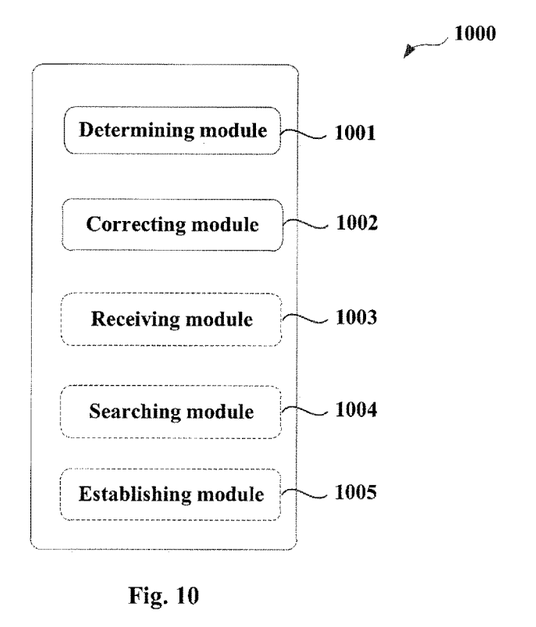
FIG. 10 is another schematic block diagram showing a radio network node suitable for implementing exemplary embodiments of the present disclosure detailed herein.

FIG. 10 is another schematic block diagram showing a radio network node 1000 suitable for implementing exemplary embodiments of the present disclosure detailed herein. As illustrated in FIG. 10, the radio network node 1000 according to the example embodiments of the present disclosure may include a determining module 1001 for determining, in a digital domain, a correction phase for the LO to offset a phase error caused by the LO pulling or pushing. The radio network node 1000 may also include a correcting module 1002 for correcting a phase of the baseband signal in the digital domain using the correction phase to compensate for the LO pulling or pushing.

In one or more embodiments, the determining the correction phase is implemented by an adaptive phase correction algorithm and the radio network node further comprises a receiving module 1003, wherein the receiving module 1003, the determining module 1001 and the correcting module 1002 iteratively perform the respective following operations until the phase error is minimized:

the receiving module 1003 receiving transmitter observing receiver signal fed back from a transmitting chain;

the determining module 1001 determining the correction phase corresponding to the phase error based on a comparison between the baseband signal and the transmitter observing receiver signal; and the correcting module correcting the phase of a subsequent baseband signal using the correction phase.

In one or more embodiments, the adaptive phase correction algorithm is a least mean square algorithm in which different step sizes are set according to different power levels of the baseband signals.

In one or more embodiments, the determining the correction phase is implemented by a look-up table in which a plurality of respective correction phases are stored in association with a plurality of respective time points and the radio network node 1000 further comprises a searching module 1004 for searching the look-up table for the correction phase based on a respective time point which corresponds to a received time of the baseband signal, and the correcting module 1002 is further configured to correct the phase of the baseband signal using the searched correction phase.

In one or more embodiments, the radio network node 1000 further comprises an establishing module 1005 for establishing a plurality of the look-up tables, each of which corresponds to a different power level of the baseband signal.

It is to be understood that the radio network node 1000 may perform operations in accordance with the example embodiments of the present disclosure, as discussed herein with the methods 300, 400, and 600.

It should be noted that although one or more embodiments of the present disclosure mainly discuss the solutions under the time division duplex ("TDD") mode, they may be also equally applied to the frequency division duplex ("FDD") mode wherein the user traffic may introduce or engender the LO pulling or pushing, for example, dynamic traffic, discontinues transmission ("DTX") and etc.

Many modifications and other embodiments of the disclosures set forth herein will come to mind to one skilled in the art to which these embodiments of the disclosure pertain having the benefit of the teachings presented in the foregoing descriptions and the associated drawings. Therefore, it is to be understood that the embodiments of the disclosure are not to be limited to the specific embodiments disclosed and that modifications and other embodiments are intended to be included within the scope of the appended claims. Although specific terms are employed herein, they are used in a generic and descriptive sense only and not for purposes of limitation.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. A method implemented by a radio network node for compensating for local oscillator pulling or pushing, the method comprising:

determining, in a digital domain, a correction phase for the local oscillator to offset a phase error caused by the local oscillator pulling or pushing; and correcting a phase of the baseband signal in the digital domain, using the correction phase, to compensate for the local oscillator pulling or pushing, wherein the radio network node operates in a frequency division duplex mode.

2. The method of claim 1, wherein the determining the correction phase is implemented by an adaptive phase correction algorithm and the method further comprises iteratively performing the following steps until the phase error is minimized:

receiving transmitter observing receiver signal fed back from a transmitting chain;

determining the correction phase corresponding to the phase error based on a comparison between the baseband signal and the transmitter observing receiver signal; and correcting the phase of a subsequent baseband signal using the correction phase.

3. The method of claim 2, wherein the adaptive phase correction algorithm is a least mean square algorithm in which different step sizes are set according to different power levels of the baseband signals.

4. The method of claim 1, wherein the determining the correction phase is implemented by a look-up table in which a plurality of respective correction phases are stored in association with a plurality of respective time points and the method further comprises:

searching the look-up table for the correction phase based on a respective time point which corresponds to a received time of the baseband signal; and correcting the phase of the baseband signal using the searched correction phase.

5. The method of claim 4, further comprising:

establishing a plurality of the look-up tables, each of which corresponds to a different power level of the baseband signal.

6. A radio network node for compensating for local oscillator pulling or pushing, the radio network node comprising:

a processor; and a memory, the memory containing instructions executable by the processor, whereby the radio network node is operative to:

determine, in a digital domain, a correction phase for the local oscillator to offset a phase error caused by the local oscillator pulling or pushing; and correct a phase of the baseband signal in the digital domain using the correction phase to compensate for the local oscillator pulling or pushing, wherein the radio network node operates in a time division duplex mode and the processor executes instructions within an uplink-downlink switching time when the radio network node operates in the time division duplex mode, or wherein the radio network node operates in a frequency division duplex mode.

7. The radio network node of claim 6, wherein the memory contains instructions for determining the correction phase using an adaptive phase correction algorithm and further comprises instructions for iteratively performing the respective following operations until the phase error is minimized:
  observing receiver signal fed back from a transmitting chain;
  determining the correction phase corresponding to the phase error based on a comparison between the baseband signal and the observed receiver signal; and
  correcting the phase of a subsequent baseband signal using the correction phase.

8. The radio network node of claim 7, wherein the adaptive phase correction algorithm is a least mean square algorithm in which different step sizes are set according to different power levels of the baseband signals.

9. The radio network node of claim 6, wherein the determining the correction phase is implemented by a look-up table in which a plurality of respective correction phases are stored in association with a plurality of respective time points, and wherein the memory further contains instructions for:
  searching the look-up table for the correction phase based on a respective time point which corresponds to a received time of the baseband signal, and
  correcting the phase of the baseband signal using the searched correction phase.

10. The radio network node of claim 9, wherein the memory further contains instructions for establishing a plurality of the look-up tables, each of which corresponds to a different power level of the baseband signal.

11. A method implemented by a radio network node for compensating for local oscillator pulling or pushing, the method comprising:
  determining, in a digital domain, a correction phase for the local oscillator to offset a phase error caused by the local oscillator pulling or pushing; and
  correcting a phase of the baseband signal in the digital domain, using the correction phase, to compensate for the local oscillator pulling or pushing,
  wherein the radio network node operates in a time division duplex mode and the method is implemented within an uplink-downlink switching time when the radio network node operates in the time division duplex mode.

12. The method of claim 11, wherein the determining the correction phase is implemented by an adaptive phase correction algorithm and the method further comprises iteratively performing the following steps until the phase error is minimized:
  receiving transmitter observing receiver signal fed back from a transmitting chain;
  determining the correction phase corresponding to the phase error based on a comparison between the baseband signal and the transmitter observing receiver signal; and
  correcting the phase of a subsequent baseband signal using the correction phase.

13. The method of claim 12, wherein the adaptive phase correction algorithm is a least mean square algorithm in which different step sizes are set according to different power levels of the baseband signals.

14. The method of claim 11, wherein the determining the correction phase is implemented by a look-up table in which a plurality of respective correction phases are stored in association with a plurality of respective time points and the method further comprises:
  searching the look-up table for the correction phase based on a respective time point which corresponds to a received time of the baseband signal; and
  correcting the phase of the baseband signal using the searched correction phase.

15. The method of claim 14, further comprising:
  establishing a plurality of the look-up tables, each of which corresponds to a different power level of the baseband signal.

* * * * *